United States Patent
Kandler et al.

(10) Patent No.: US 11,565,933 B2
(45) Date of Patent: Jan. 31, 2023

(54) SENSOR PACKAGE

(71) Applicant: Infineon Technologies AG, Neubiberg (DE)

(72) Inventors: Michael Kandler, Sauerlach (DE); Alfred Niklas, Poing (DE)

(73) Assignee: Infineon Technologies AG, Neubiberg (DE)

( * ) Notice: Subject to any disclaimer, the term of this patent is extended or adjusted under 35 U.S.C. 154(b) by 257 days.

(21) Appl. No.: 16/051,137

(22) Filed: Jul. 31, 2018

(65) Prior Publication Data

US 2020/0039815 A1 Feb. 6, 2020

(51) Int. Cl.
*B81B 7/00* (2006.01)
*H03K 19/17736* (2020.01)

(52) U.S. Cl.
CPC .......... *B81B 7/0038* (2013.01); *B81B 7/0006* (2013.01); *B81B 7/0025* (2013.01); *B81B 7/0048* (2013.01); *H03K 19/17736* (2013.01); *B81B 2201/0235* (2013.01); *B81B 2201/0242* (2013.01); *B81B 2201/0264* (2013.01)

(58) Field of Classification Search
CPC ............ H03K 19/17736; B81B 7/0054; B81B 7/0025; B81B 7/0006; B81B 7/0048; B81B 7/0058; B81B 7/0038; B81B 2201/0264; B81B 2201/0235; B81B 2201/0242

See application file for complete search history.

(56) References Cited

U.S. PATENT DOCUMENTS

| | | | |
|---|---|---|---|
| 2015/0108653 A1* | 4/2015 | Hooper | B81C 1/00301 257/774 |
| 2015/0270206 A1 | 9/2015 | Lo et al. | |
| 2015/0274515 A1* | 10/2015 | Bowles | B81B 7/02 438/51 |
| 2015/0380394 A1* | 12/2015 | Jang | H01L 25/0657 438/108 |
| 2016/0130137 A1* | 5/2016 | Huang | B81C 1/00285 438/51 |
| 2016/0219377 A1* | 7/2016 | Chi | H04R 19/005 |

(Continued)

FOREIGN PATENT DOCUMENTS

| | | |
|---|---|---|
| DE | 102010031432 A1 | 1/2012 |
| EP | 2993442 A1 | 3/2016 |
| WO | WO 2017012251 A1 | 1/2017 |

*Primary Examiner* — Vongsavanh Sengdara
(74) *Attorney, Agent, or Firm* — Harrity & Harrity, LLP

(57) ABSTRACT

A sensor device may include a base layer, and an ASIC element disposed on the base layer. The ASIC element may include a plurality of electrical contact points. The sensor device may include a MEMS element. The MEMS element may include a plurality of through-silicon vias. The sensor device may include a plurality of conductive contact elements. Each conductive contact element may be disposed between, and electrically coupling, a respective through-silicon via and a respective electrical contact point. The sensor device may include a protective layer disposed between the ASIC element and the MEMS element. The protective layer may be composed of material(s) having a physical property defined to permit the protective layer to mitigate stress forces directed from the ASIC element to the MEMS element, to prevent corrosion, and/or to prevent leakage current between electrical connections due to pollution and/or humidity.

16 Claims, 10 Drawing Sheets

(56) References Cited

U.S. PATENT DOCUMENTS

| | | |
|---|---|---|
| 2017/0008760 A1 | 1/2017 | Lloyd et al. |
| 2017/0081178 A1 | 3/2017 | Speight et al. |
| 2019/0020343 A1* | 1/2019 | Lee .................... H01L 27/1203 |
| 2019/0100428 A1* | 4/2019 | Vummidi Murali ........................ B81C 1/0023 |

* cited by examiner

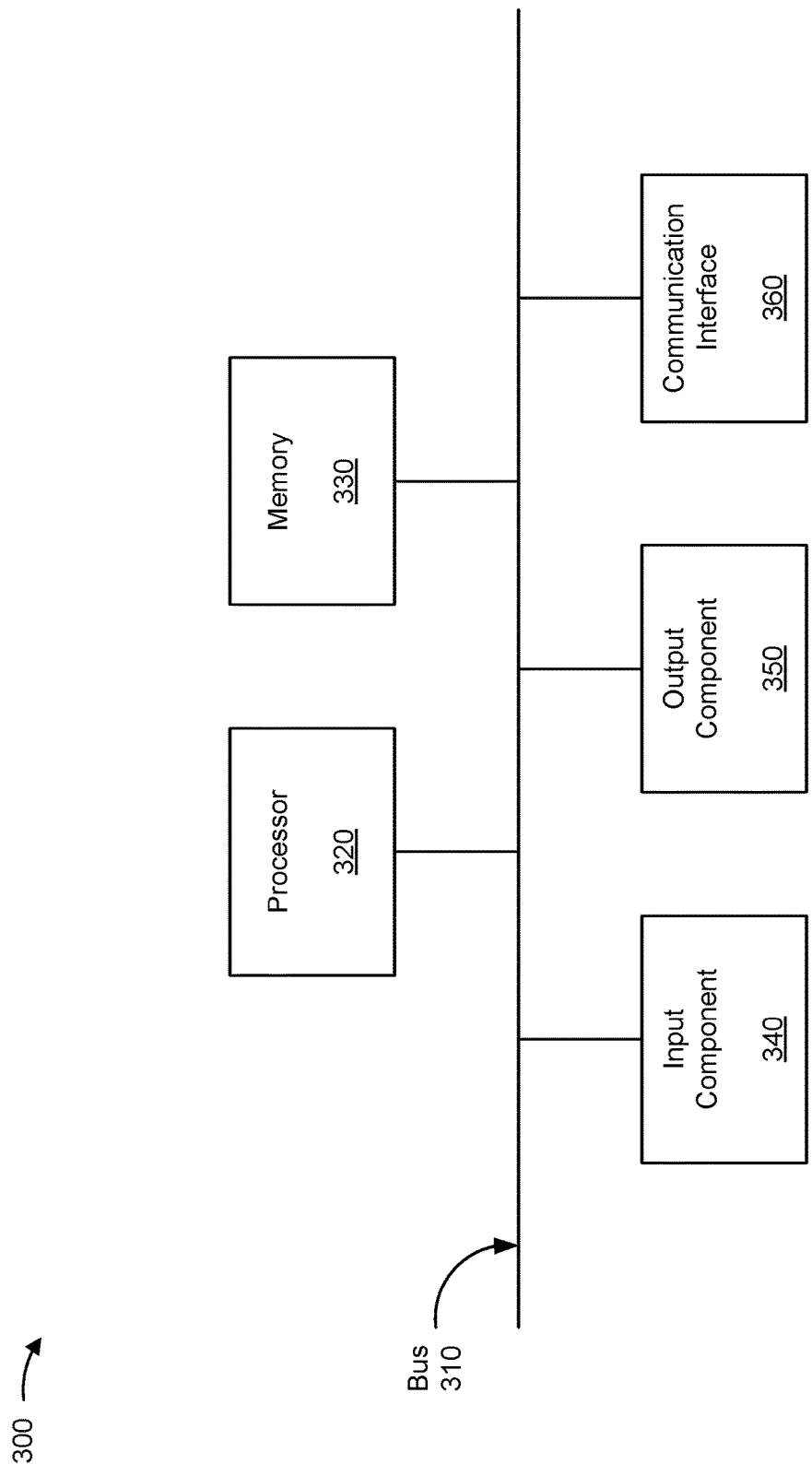

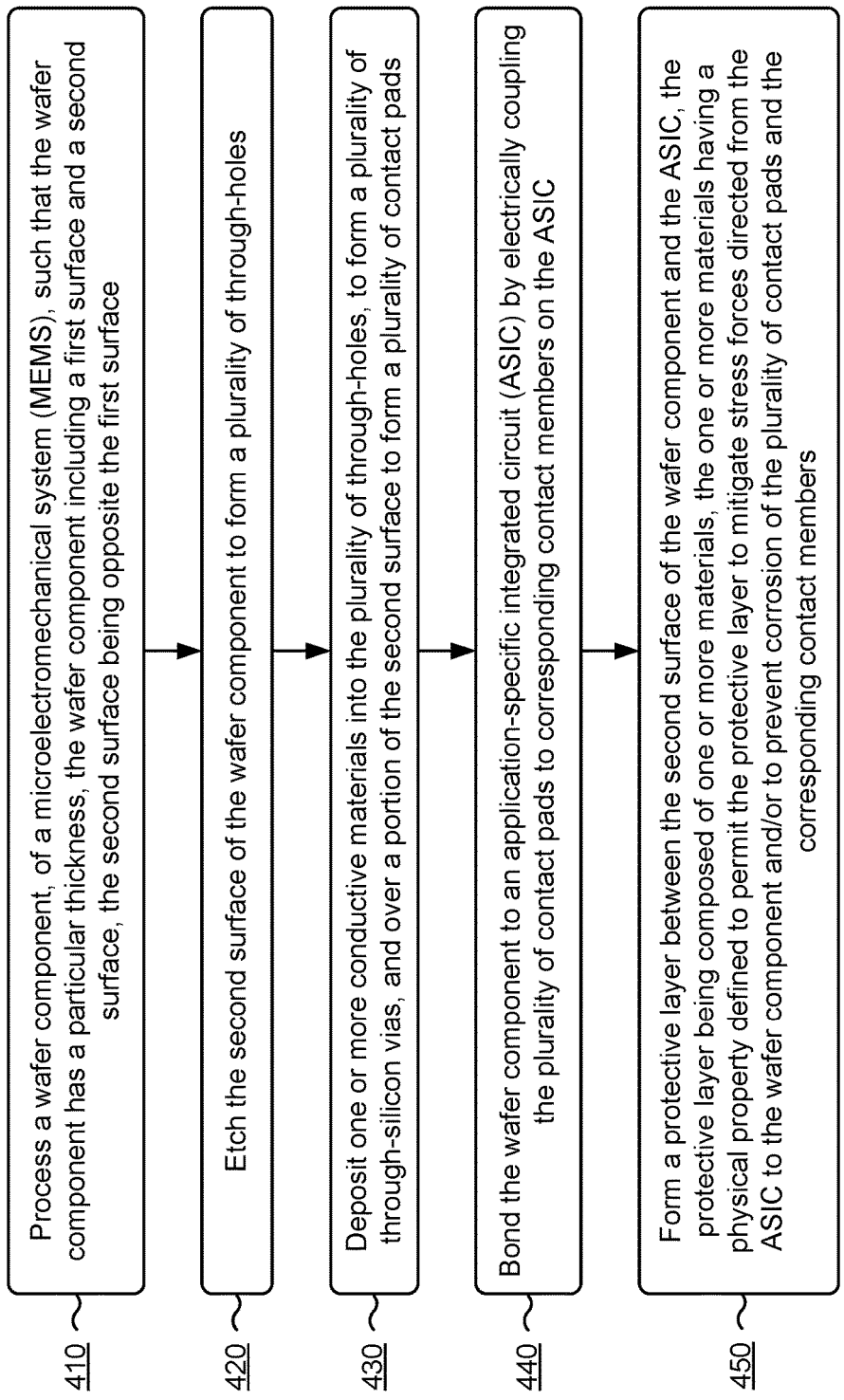

SENSOR PACKAGE

BACKGROUND

Pressure sensor systems, such as those employed in a vehicle, including pressure sensor packages. A pressure sensor package typically includes an application-specific integrated circuit (ASIC), and a microelectromechanical system (MEMS) configured to detect a pressure of a target media (e.g., one or more gases, liquids, and/or the like) in an environment of the pressure sensor package.

SUMMARY

According to some implementations, a sensor device may include a base layer, and an application-specific integrated circuit (ASIC) element disposed on the base layer. The ASIC element may include a plurality of electrical contact points. The sensor device may include a microelectromechanical system (MEMS) element. The MEMS element may include a plurality of through-silicon vias. The sensor device may include a plurality of conductive contact elements. Each conductive contact element, of the plurality of conductive contact elements, may be disposed between, and electrically coupling, a respective through-silicon via, of the plurality of through-silicon vias, and a respective electrical contact point of the plurality of electrical contact points. The sensor device may include a protective layer disposed between the ASIC element and the MEMS element. The protective layer may be composed of one or more materials. The one or more materials may have a physical property defined to permit the protective layer to mitigate stress forces directed from the ASIC element to the MEMS element, to prevent corrosion, and/or to prevent leakage current between electrical connections due to pollution and/or humidity.

According to some implementations, a sensor package may include a frame and an application-specific integrated circuit (ASIC) element. The ASIC element may include a plurality of contact members and a first die. The first die may be coupled to the frame. The sensor package may include a microelectromechanical system (MEMS) element. The MEMS element may include a second die. The second die may include a plurality of conductive vias disposed through the second die. Each contact member, of the plurality of contact members, may be electrically coupled to a conductive via of the plurality of conductive vias. The sensor package may include a protective layer disposed between the first die and the second die. The protective layer may be composed of one or more materials. The one or more materials may have a physical property defined to enable the protective layer to prevent forces, impacting the first die, from impacting the second die and/or to prevent corrosion of the plurality of conductive vias and the plurality of contact members.

According to some implementations, a method may include processing a wafer component, of a microelectromechanical system (MEMS), such that the wafer component has a particular thickness. The wafer component may include a first surface and a second surface. The second surface may be opposite the first surface. The method may include etching the second surface of the wafer component to form a plurality of through-holes, depositing one or more conductive materials into the plurality of through-holes, to form a plurality of through-silicon vias, and over the second surface to form a plurality of contact pads, bonding the wafer component to an application-specific integrated circuit (ASIC) by electrically coupling the plurality of contact pads to corresponding contact members on the ASIC, and forming a protective layer between the second surface of the wafer component and the ASIC. The protective layer may be composed of one or more materials. The one or more materials may have a physical property defined to permit the protective layer to mitigate stress forces directed from the ASIC to the wafer component and/or to prevent corrosion of the plurality of contact pads and the corresponding contact members.

BRIEF DESCRIPTION OF THE DRAWINGS

FIG. 3 is a diagram of example components of one or more devices of FIG. 2.

FIG. 4 is a flow chart of an example process for manufacturing a sensor package.

DETAILED DESCRIPTION

Figure 1A:
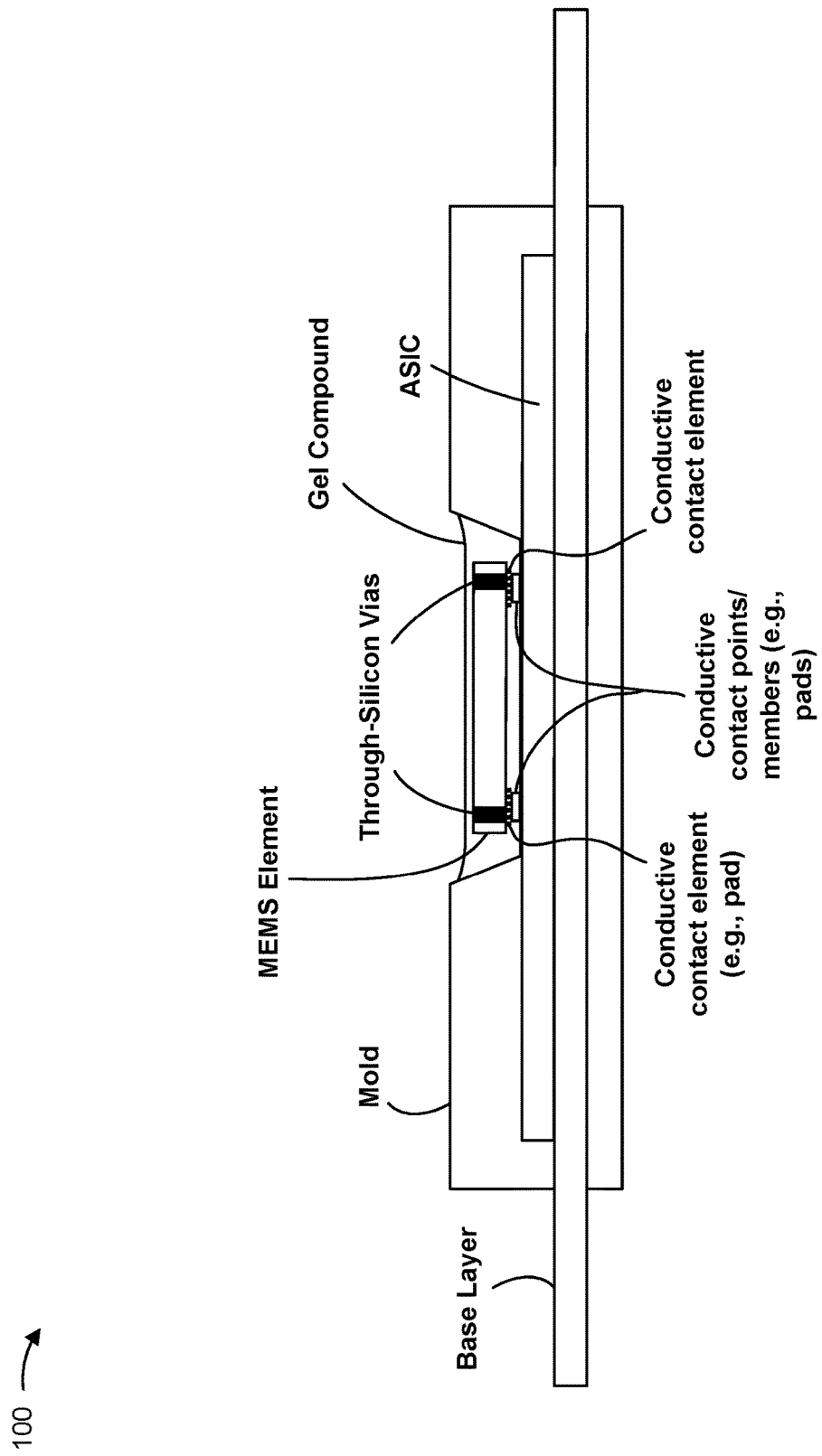
FIGS. 1A-1G are diagrams illustrating cross-sectional views of an example implementation described herein.

The following detailed description of example implementations refers to the accompanying drawings. The same reference numbers in different drawings may identify the same or similar elements.

Some conventional sensor packages, such as a manifold air pressure sensor, barometric air pressure sensor, and/or a side airbag pressure sensor (a MAP/BAP/SAP sensor), include a single die in which a MEMS element is integrated into an ASIC. However, this prevents the same sensor package from being adapted (e.g., by exchanging the MEMS element or the ASIC) for use in different applications. Indeed, different sensor package configurations, involving complex design and manufacturing processes, are currently used for different applications—e.g., a sensor package in a tire pressure monitoring system (TPMS) is configured differently than a sensor package in a MAP/BAP/SAP sensor. Existing sensor package configurations are also subject to various operational issues. For example, a conventional TPMS sensor package includes a MEMS element submerged in a gel compound, where the MEMS element and the gel compound are fully encapsulated by a mold compound. In such a sensor package, a pressure may be established in the gel compound that leads to sensor signal drifts over time. In other sensor package types, the MEMS element is arranged to be in direct contact with a mold compound of the overall sensor package, which introduces stress to the MEMS element. Further, existing sensor packages lack structural integrity, and are subject to sealing issues at a pressure port of the sensor. Furthermore, sensor packages that employ bond wires (e.g., gold bond wires), between the MEMS element and the ASIC, are not only larger and more costly, but such bond wires are also susceptible to corrosion (e.g., in the presence of humidity, due to electrical current leakage resulting from exposure to harsh or "aggressive" media (e.g., pressurized gases, liquids, and/or the like, such as re-circulated exhausted gases (EGR)), and/or the like).

Some implementations, described herein, provide a sensor package that includes a MEMS element having through-silicon vias, an ASIC electrically bonded to the through-silicon vias, and a protective layer disposed between the MEMS element and the ASIC and surrounding electrical bonding areas between the MEMS element and the ASIC. In some implementations, the protective layer is composed of one or more materials that are capable of providing stress decoupling between the MEMS element and the ASIC, and capable of protecting the electrical bonding areas from corrosion.

Improved structural integrity of the sensor package permits proper sealing of a pressure port of the sensor (which typically involves the application of a large amount of force at the pressure port). In addition, protecting the electrical bonding areas between the MEMs element and the ASIC also prevents corrosion, thereby further ensuring the proper operation of the sensor components, and extending the life of the sensor package.

Further, a tighter sensor package also protects the sensor components, such as the MEMS element, from target media, which permits use of the sensor package for various applications, such as in environments that contain harsh media. Furthermore, separating the MEMS element from the ASIC also provides a uniform, or unified, sensor package configuration that can be used for different types of applications. This offers flexibility in chip selection (e.g., the type of pressure sensor or cell to use, the type of ASIC to use, and/or the like) depending on the application, thus permitting faster production times. Moreover, the use of through-silicon vias permits reduced sensor package sizes (e.g., allows for small, flatter sensor modules, such as those having dimensions as small as 4 millimeters (mm) by 4 mm by 2 mm and/or the like) and lowers costs, since no bonding wires (e.g., gold wires/pads, which might otherwise be utilized for media compatibility) may be needed. A reduced sensor package size also reduces or eliminates cavities within the sensor package (e.g., cavities which may become pressurized and, therefore, cause pressure equalization delays in the sensor package), which also ensures the proper operation of the sensor components, and extends the overall life of the sensor package.

FIGS. 1A-1G are diagrams illustrating cross-sectional views of an example implementation 100 described herein. As shown in FIG. 1A, example implementation 100 may include a sensor package having a base layer (e.g., a leadframe), an ASIC, a MEMS element (e.g., a pressure sensor, an accelerometer, a gyroscope, and/or another type of sensor) that includes through-silicon vias, a mold (or a molded structure) that at least partially surrounds the ASIC and/or the MEMS element, and a gel-based compound that surrounds the MEMS element within a cavity of the mold. The base layer may be composed of any material (e.g., metal and/or the like) suitable for electrically connecting to a backside, or underside, of the ASIC (e.g., for ground connection), and for forming conductive pins of the sensor package.

Figure 1B:
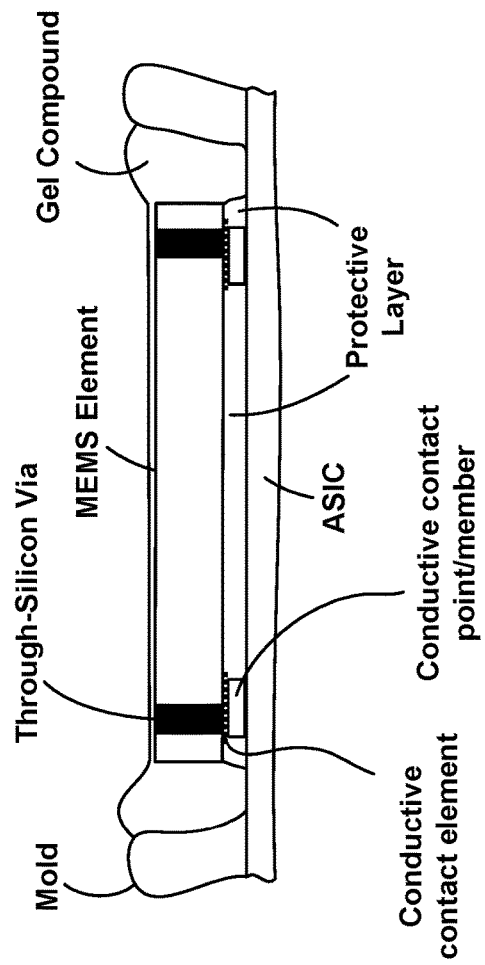

As shown in FIG. 1A, the MEMS element may be electrically coupled, or bonded, to the ASIC via conductive contact elements (e.g., pads), disposed or formed on an underside of the MEMS element, and conductive contact points/members (e.g., pads) disposed or formed on an upper side of the ASIC. As shown in FIG. 1B, the sensor package may include a protective layer disposed between the MEMS element and the ASIC.

In some implementations, the protective layer may be configured to provide stress decoupling between the MEMS element and the ASIC. For example, the protective layer may be composed of one or more materials in which a hardness parameter and/or an elasticity parameter (e.g., a Young's modulus) is defined such that the protective layer can mitigate some or all forces that may be directed from the ASIC to the MEMS element. As some examples, the protective layer may be composed of silicone, epoxy (e.g., soft epoxy), cynate ester, acrylat, a laminated film (e.g., composed of polyethylenterephthalat and/or the like), a mold compound, and/or the like. In some implementations, the hardness parameter and/or the elasticity parameter may be defined such that mechanical stability and protection capability are provided (e.g., where the material is not too soft that mechanical stability and protection capability suffer).

In some implementations, the protective layer may be disposed and/or configured to protect the electrical bonding areas between the MEMS element and the ASIC—e.g., by preventing media (e.g., surrounding gases and/or the like) from contacting the electrical bonding areas (which may otherwise cause the electrical bonding areas to become corroded). As shown in FIG. 1B, for example, the protective layer may surround the conductive contact elements and the conductive contact points.

Sensor package implementations, described herein, may be manufactured or provided in a variety of ways. In some implementations, a process for providing a sensor package may include processing a MEMS element. For example, the process may include disposing a layer of material (e.g., a metal layer) onto a surface (e.g., a front surface or an upper side) of a wafer (or die) component (e.g., a silicon-based wafer and/or the like) of the MEMS element. In some implementations, the process may include trimming (e.g., "thinning") the wafer component such that the wafer component satisfies a threshold (e.g., has a certain thickness, such as about 200 micrometers (μm) and/or the like), depositing an oxide layer on another surface (e.g., a back surface or an underside) of the wafer component for masking a subsequent through-silicon via etching procedure.

In some implementations, the process may include etching (e.g., deep trench etching at a high aspect ratio (e.g., about 1:10 and/or the like), anisotropic etching, and/or the like) multiple holes (e.g., at about 20 μm in diameter and/or the like) in the underside of the wafer component. In some implementations, the etching may terminate at the metal layer on the upper surface of the wafer component.

In some implementations, the process may include disposing an insulating layer over a circumference of each of the holes (e.g., inner walls of the holes) (e.g., a Tetraethyl orthosilicate (TEOS) process). In some implementations, the process may include filling each of the holes with a conductive material (e.g., tungsten, poly silicon, nickel, copper, and/or the like) to derive through-silicon vias, and permitting the conductive material to deposit or overlay on a portion (or the entirety) of the underside of the wafer component.

Figure 1C:
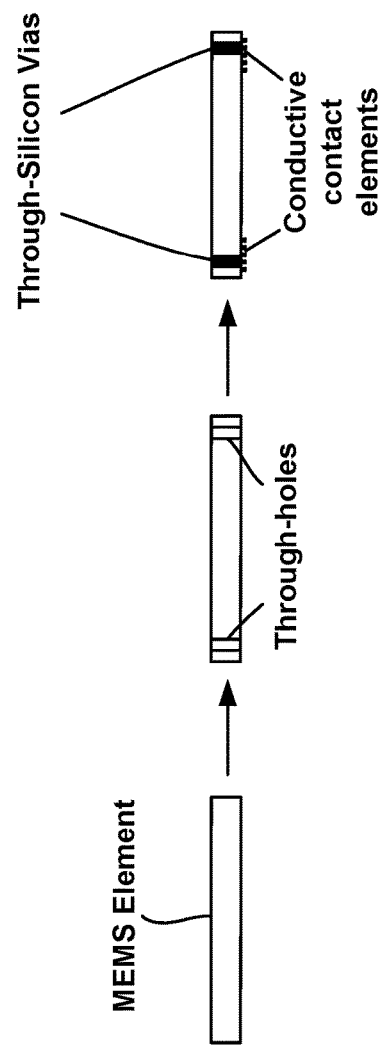

In some implementations, the process may include manipulating (e.g., "structuring") portions of the conductive material, on the underside of the wafer component, to form conductive contact elements (e.g., pads). Forming the conductive contact elements on the underside of the MEMS element provides space for flexible placement of electronic chips and/or circuitry on the upper side of the MEMS element. FIG. 1C is a diagram illustrating stages of an example procedure for forming through-silicon vias and conductive contact elements.

Although through-silicon vias are described above as being formed after MEMS processing, in some implementations, MEMS processing may be performed after forming through-silicon vias in a wafer component.

In some implementations, the process may include forming conductive contact points or members (e.g., micro bumps) on a surface (e.g., a front surface or an upper side) of an ASIC for one-to-one matching with the conductive contact elements formed on the underside of the MEMS element. For example, the process may include forming conductive contact points over contact pads (e.g., gold contact pads and/or the like) disposed on the upper side of the ASIC.

Figure 1D:
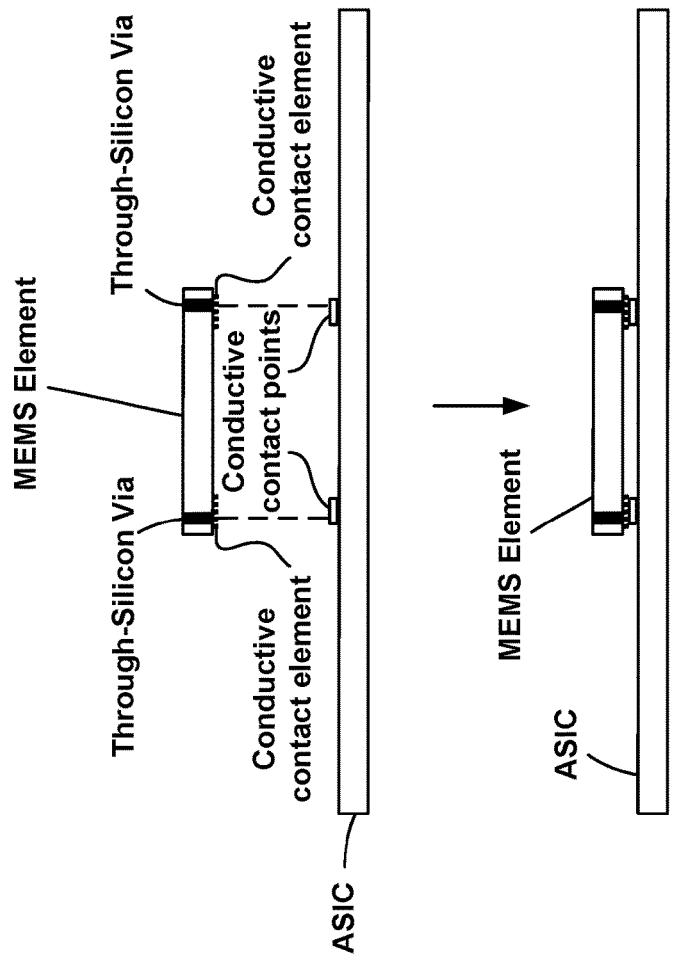

In some implementations, the process may include aligning the conductive contact elements of the MEMS element and the corresponding conductive contact points of the ASIC, and bonding (e.g., via heat and/or pressure) the MEMS element and the ASIC together at the conductive contact elements and the conductive contact points. FIG. 1D is a diagram illustrating stages of an example procedure for bonding the MEMS element and the ASIC.

In some implementations, the process may include applying or forming a protective layer for the sensor package. In some implementations, the protective layer may be formed prior to electrical bonding of the MEMS element and the ASIC. In such cases, material(s) (e.g., glue), such as that based on silicone, epoxy (e.g., soft epoxy), cyanate ester, acrylat, a laminated film, and/or the like, may be used to form the protective layer. FIG. 1B is a diagram showing an example sensor package implementation in which the protective layer is formed prior to electrical bonding of the MEMS element and the ASIC.

In some implementations, a pattern dispensing technique may be employed to form the protective layer. For example, the material(s) may be printed (e.g., in small dots using an ink-jet-like printing technique) over a surface of the ASIC (and/or over an underside of the MEMS element)—e.g., permitting fine control over where the material(s) are deposited (e.g., away from areas of the MEMS element and the ASIC that are to be electrically bonded)—after which the MEMS element and the ASIC may be electrically bonded.

Alternatively, in some implementations, the material(s), used to form the protective layer, may be applied over the ASIC (and/or on an underside of the MEMS element) (e.g., globally applied over the areas of the ASIC and/or the MEMS element that are to be electrically bonded). In such a case, the applied material(s) may be displaced during electrical bonding of the MEMS element and the ASIC.

Figure 1E:
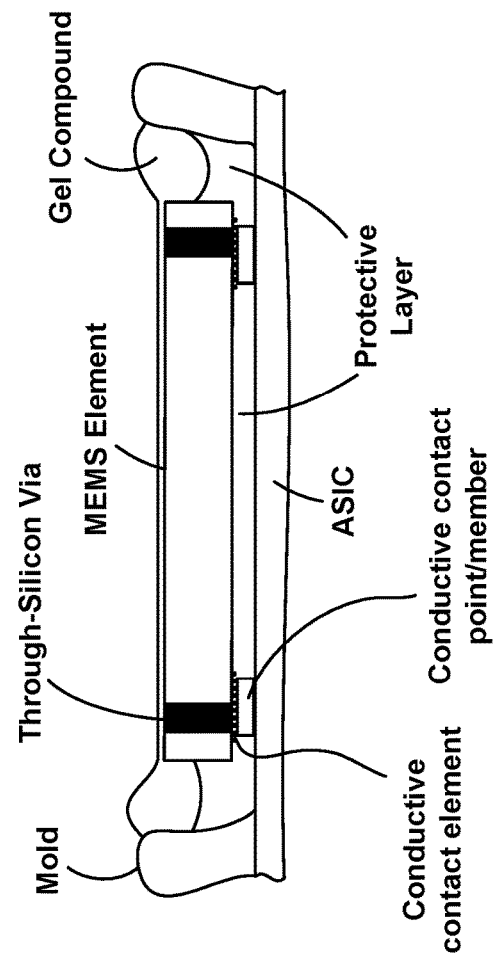

In some implementations, the protective layer may be formed after the MEMS element and the ASIC are electrically bonded. In such cases, material(s) (e.g., glue), such as that based on silicone, epoxy (e.g., soft epoxy), cyanate ester, acrylat, and/or the like, may be used to form the protective layer. In some implementations, a low viscous glue may be permitted to flow between the MEMS element and the ASIC (e.g., via a capillary effect and/or the like) to form the protective layer. FIG. 1E is a diagram showing an example sensor package implementation in which the protective layer is formed after electrical bonding of the MEMS element and the ASIC.

Regardless of whether the protective layer is formed before or after electrically bonding the MEMS element and the ASIC, the protective layer may protect the electrical bonding areas from corrosion (e.g., corrosion that might result from exposure to environmental media) and, in conjunction with proper arrangement of the conductive contact elements on the underside of the MEMS element, may reduce or eliminate stress force transfers from the mold-embedded ASIC to the MEMS element, thus protecting the MEMS element from damage, and improving the overall structural integrity of the sensor package.

In some implementations, the process of forming a sensor package may include providing a mold to surround and/or support the MEMS element and the ASIC. In some implementations, the process may include providing a mold prior to electrically bonding the MEMS element and the ASIC. In such cases, the process may including employing a film-assisted molding procedure, where the MEMS element is coupled to an unmolded portion of the ASIC.

Figure 1F:
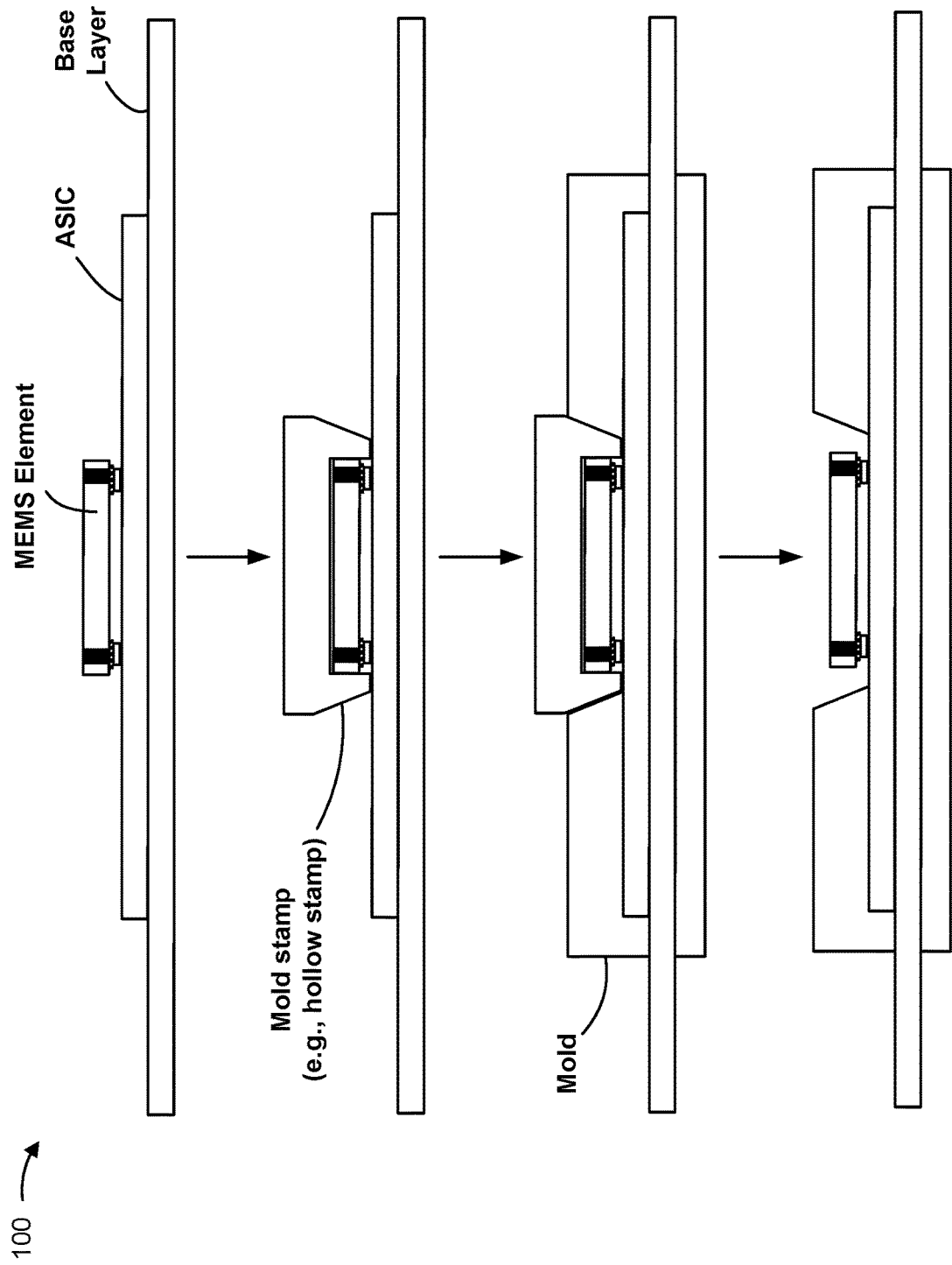

Alternatively, the process may include providing a mold after electrically bonding the MEMS element and the ASIC. In such cases, the process may include employing a mold stamp (e.g., a hollow stamp) to protect the MEMS element during the molding process. FIG. 1F is a diagram illustrating stages of an example molding procedure using a mold stamp. As shown in FIG. 1F, a mold stamp may be disposed to at least partially surround the MEMS element, and mold may be deposited to form a molded structure, after which the mold stamp may be removed.

Figure 1G:
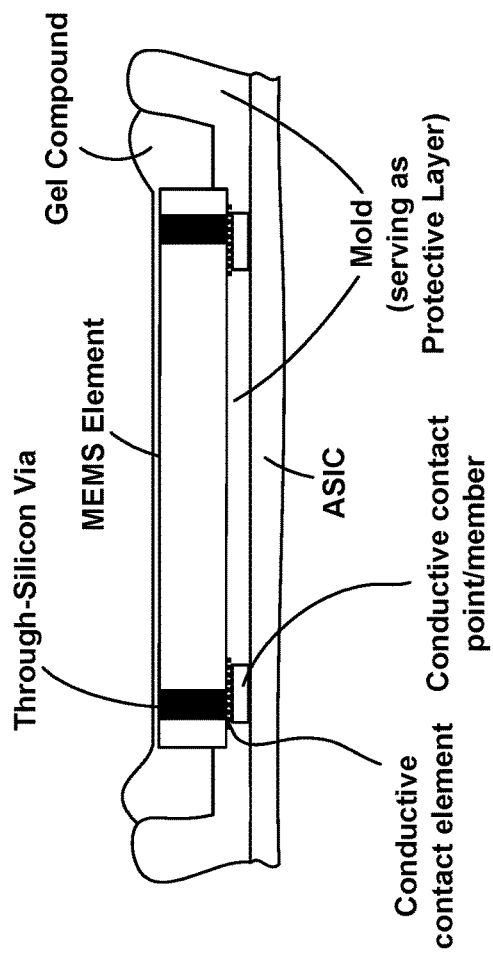

In some implementations, the protective layer may be formed as part of a molding procedure. In such cases, the protective layer may be formed after electrically bonding the MEMS element and the ASIC. FIG. 1G is a diagram showing an example sensor package implementation in which a mold is used to form the protective layer.

In some implementations, the process may include depositing a gel compound into a cavity surrounding the MEMS element for protection from liquids and/or particles. Alternatively, in cases where target media is not expected to negatively impact the operation of the MEMS element, minimal, or no, gel compound may be needed for the sensor package.

Improved structural integrity of the sensor package permits proper sealing of a pressure port of the sensor (which typically involves the application of a large amount of force at the pressure port). In addition, protecting the electrical bonding areas between the MEMs element and the ASIC also prevents corrosion, thereby further ensuring the proper operation of the sensor components, and extending the life of the sensor package.

Further, a tighter sensor package also protects the sensor components, such as the MEMS element, from target media, which permits use of the sensor package for various applications, such as in environments that contain harsh media. Furthermore, separating the MEMS element from the ASIC also provides a uniform, or unified, sensor package configuration that can be used for different types of applications. This offers flexibility in chip selection (e.g., the type of pressure sensor or cell to use, the type of ASIC to use, and/or the like) depending on the application, thus permitting faster development times. Moreover, the use of through-silicon vias permits reduced sensor package sizes (e.g., allows for small, flatter sensor modules, such as those having dimensions as small as 4 mm by 4 mm by 2 mm and/or the like) and lowers costs, since no bonding wires (e.g., gold wires/pads, which might otherwise be utilized for media compatibility) may be needed. A reduced sensor package size also reduces or eliminates cavities within the sensor package (e.g., cavities which may become pressurized and, therefore, cause pressure equalization delays in the sensor package), which also ensures the proper operation of the sensor components, and extends the overall life of the sensor package.

As indicated above, FIGS. 1A-1G are provided merely as examples. Other examples are possible and may differ from what was described with regard to FIGS. 1A-1G.

Figure 2:
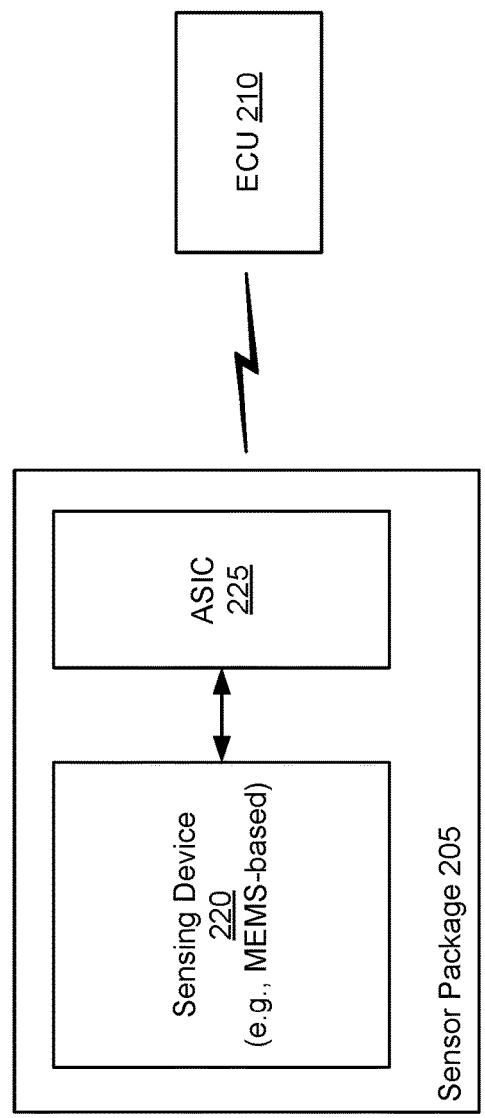
FIG. 2 is a diagram of an example environment in which techniques, devices, systems, and/or methods, described herein, may be implemented.

FIG. 2 is a diagram of an example environment 200 in which techniques, devices, systems, and/or methods described herein may be implemented. As shown in FIG. 2, environment 200 may include a sensor package 205 communicatively coupled to an electronic control unit (ECU) 210.

Sensor package 205 includes a housing associated with one or more components of a sensor for measuring one or more characteristics or physical parameters (e.g., an amount of pressure, a speed of an object, a position of an object, an angle of rotation of an object, a temperature, an amount of current, an amount of voltage, and/or the like). In some implementations, sensor package 205 may correspond to one or more sensor package implementations described elsewhere herein. As shown, sensor package 205 includes a sensing device 220 (e.g., a MEMS-based sensing device) and circuitry—e.g., an ASIC 225. In some implementations, sensor package 205 is remote from ECU 210 and connected to ECU 210 via a bus (e.g., via a wired connection).

Sensing device 220 includes a device capable of performing a sensing function (e.g., sampling a sensor signal, calculating and/or determining sensor data, and/or the like). Sensing device 220 may be communicatively coupled to ASIC 225 (e.g., via through-silicon vias, conductive contact elements, conductive contact points/members, and/or the like, as described elsewhere herein). In some implementations, ASIC 225 may include an analog-to-digital convertor, a digital signal processor, a memory component, a digital interface, and/or the like that facilitate the sensing function. In some implementations, ASIC 225 may include a transceiver configured to transmit and receive information (e.g., between sensing device 220, ECU 210, and/or the like). For example, the transceiver may include a differential line transceiver or a similar type device. In some implementations, the transceiver may include a transmit component that allows sensor package 205 to transmit information (e.g., data samples and/or the like) to ECU 210 via a bus, and a receive component that allows sensor package 205 to receive information from ECU 210 via the bus. In some implementations, the transceiver may include a line driver for enabling the transmit component to transmit information, or the receive component to receive information, at a given time.

ECU 210 includes one or more devices associated with controlling one or more electrical systems and/or electrical subsystems based on sensor data provided by sensor package 205. As shown, ECU 210 may include a transceiver and a microcontroller (μC). In some implementations, the μC may be capable of calibrating, controlling, adjusting, and/or the like the one or more electrical systems and/or electrical subsystems based on sensor data transmitted by sensor package 205. For example, in some implementations, the μC may include an electronic/engine control module (ECM), a powertrain control module (PCM), a transmission control module (TCM), a brake control module (BCM or EBCM), a central control module (CCM), a central timing module (CTM), a general electronic module (GEM), a body control module (BCM), a suspension control module (SCM), or another electrical system or electrical subsystem of a vehicle.

The number and arrangement of apparatuses shown in FIG. 2 is provided as an example. In practice, there may be additional devices and/or components, fewer devices and/or components, different devices and/or components, or differently arranged devices and/or components than those shown in FIG. 2.

FIG. 3 is a diagram of example components of a device 300. Device 300 may correspond to sensor package 205, ASIC 225, and/or ECU 210 of FIG. 2. In some implementations, sensor package 205, ASIC 225, and/or ECU 210 may include one or more devices 300 and/or one or more components of device 300. As shown in FIG. 3, device 300 may include a bus 310, a processor 320, a memory 330, an input component 340, an output component 350, and a communication interface 360.

Bus 310 includes a component that permits communication among the components of device 300. Processor 320 is implemented in hardware, firmware, or a combination of hardware and software. Processor 320 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Input component 340 includes a component that permits device 300 to receive information, such as via user input (e.g., a touch screen display, a keyboard, a keypad, a mouse, a button, a switch, and/or a microphone) or instructions provided by another device. Output component 350 includes a component that provides output information from device 300 (e.g., a display, a speaker, and/or one or more light-emitting diodes (LEDs)).

Communication interface 360 includes a transceiver-like component (e.g., a transceiver and/or a separate receiver and transmitter) that enables device 300 to communicate with other devices, such as via a wired connection, a wireless connection, or a combination of wired and wireless connections. Communication interface 360 may permit device 300 to receive information from another device and/or provide information to another device. For example, communication interface 360 may include a peripheral sensor interface 5 (PSI5), a serial peripheral interface (SPI), an inter-integrated circuit ($I^2C$)-based interface, a short pulse width modulation code (SPC)-based interface, and/or the like. As another example, communication interface 360 may include an Ethernet interface, an optical interface, a coaxial interface, an infrared interface, a radio frequency (RF) interface, a universal serial bus (USB) interface, a wireless local area network, a cellular network interface, and/or the like.

Device 300 may perform one or more processes described herein. Device 300 may perform these processes based on processor 320 executing software instructions stored by a non-transitory computer-readable medium, such as memory 330. A computer-readable medium is defined herein as a non-transitory memory device. A memory device includes memory space within a single physical storage device or memory space spread across multiple physical storage devices.

Software instructions may be read into memory 330 from another computer-readable medium or from another device via communication interface 360. When executed, software instructions stored in memory 330 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for manufacturing a sensor package. As shown in FIG. 4, process 400 may include processing a wafer component, of a microelectromechanical system (MEMS), such that the wafer component has a particular thickness (block 410). For example, process 400 may include processing a wafer component, of a MEMS, such that the wafer component has a particular thickness, as described above in connection with FIGS. 1A-1G. In some implementations, the wafer component may include a first surface and a second surface. In some implementations, the second surface may be opposite the first surface.

As further shown in FIG. 4, process 400 may include etching the second surface of the wafer component to form a plurality of through-holes (block 420). For example, process 400 may include etching the second surface of the wafer component to form a plurality of through-holes, as described above in connection with FIGS. 1A-1G.

As further shown in FIG. 4, process 400 may include depositing one or more conductive materials into the plurality of through-holes, to form a plurality of through-silicon vias, and over the second surface to form a plurality of contact pads (block 430). For example, process 400 may include depositing one or more conductive materials into the plurality of through-holes, to form a plurality of through-silicon vias, and over the second surface to form a plurality of contact pads, as described above in connection with FIGS. 1A-1G.

As further shown in FIG. 4, process 400 may include bonding the wafer component to an application-specific integrated circuit (ASIC) by electrically coupling the plurality of contact pads to corresponding contact members on the ASIC (block 440). For example, process 400 may include bonding the wafer component to an ASIC by electrically coupling the plurality of contact pads to corresponding contact members on the ASIC, as described above in connection with FIGS. 1A-1G.

As further shown in FIG. 4, process 400 may include forming a protective layer between the second surface of the wafer component and the ASIC (block 450). For example, process 400 may include forming a protective layer between the second surface of the wafer component and the ASIC, as described above in connection with FIGS. 1A-1G. In some implementations, the protective layer may be composed of one or more materials. In some implementations, the one or more materials may have a physical property defined to permit the protective layer to mitigate stress forces directed from the ASIC to the wafer component and/or to prevent corrosion of the plurality of contact pads and the corresponding contact members.

Process 400 may include additional implementations, such as any single implementation or any combination of implementations described below and/or in connection with one or more other processes described elsewhere herein.

In some implementations, process 400 may include providing a mold that at least partially surrounds the wafer component and the ASIC. In some implementations, process 400 may include forming the protective layer using at least a portion of the mold. In some implementations, process 400 may include permitting a glue, having less than a particular viscosity, to flow, via a capillary effect, into a space between the wafer component and the ASIC. In some implementations, the glue may be composed of silicon, epoxy, cyanate ester, or acrylat.

In some implementations, a sensor device may include a base layer, and an application-specific integrated circuit (ASIC) element disposed on the base layer. In some implementations, the ASIC element may include a plurality of electrical contact points. In some implementations, the sensor device may include a microelectromechanical system (MEMS) element. In some implementations, the MEMS element may include a plurality of through-silicon vias. In some implementations, the sensor device may include a plurality of conductive contact elements. In some implementations, each conductive contact element, of the plurality of conductive contact elements, may be disposed between, and electrically coupling, a respective through-silicon via, of the plurality of through-silicon vias, and a respective electrical contact point of the plurality of electrical contact points. In some implementations, the sensor device may include a protective layer disposed between the ASIC element and the MEMS element. In some implementations, the protective layer may be composed of one or more materials. In some implementations, the one or more materials may have a physical property defined to permit the protective layer to mitigate stress forces directed from the ASIC element to the MEMS element, to prevent corrosion, and/or to prevent leakage current between electrical connections due to pollution and/or humidity.

In some implementations, the MEMS element may include a pressure sensor, an accelerometer, and/or a gyroscope.

In some implementations, the sensor device may further include a mold compound. In some implementations, the ASIC element may be embedded in the mold compound.

In some implementations, the physical property may be defined to permit the protective layer to mitigate stress forces directed from the mold compound, and via the ASIC element, to the MEMS element.

In some implementations, the one or more materials may include an adhesive material. In some implementations, the adhesive material may include silicone, epoxy, cynate ester, acrylat, polyethylenterephthalat, or a mold compound.

In some implementations, the protective layer may be disposed about the plurality of conductive contact elements to prevent foreign substances from contacting the plurality of conductive contact elements.

In some implementations, the ASIC element may be implemented in a first chip and the MEMS element may be implemented in a second chip. In some implementations, the first chip may be separate from the second chip. In some implementations, the ASIC element, the MEMS element, the plurality of conductive contact elements, and the protective layer may be disposed in a single sensor package. In some implementations, the single sensor package may have a first length of about 4 millimeters in a first dimension, a second length of about 4 millimeters in a second dimension, and a third length of about 2 millimeters in a third dimension.

In some implementations, the sensor device may contain no gold wires or gold pads. In some implementations, the sensor device may contain no bond wire loops that extend beyond a top surface of the MEMS element. In some implementations, the sensor device may further include a gel-based compound disposed about the MEMS element.

In some implementations, a sensor package may include a frame and an application-specific integrated circuit (ASIC) element. In some implementations, the ASIC element may include a plurality of contact members and a first die. In some implementations, the first die may be coupled to the frame. In some implementations, the sensor package may include a microelectromechanical system (MEMS) element.

In some implementations, the MEMS element may include a second die. In some implementations, the second die may include a plurality of conductive vias disposed through the second die. In some implementations, each contact member, of the plurality of contact members, may be electrically coupled to a conductive via of the plurality of conductive vias. In some implementations, the sensor package may include a protective layer disposed between the first die and the second die. In some implementations, the protective layer may be composed of one or more materials. In some implementations, the one or more materials may have a physical property defined to enable the protective layer to prevent forces, impacting the first die, from impacting the second die and/or to prevent corrosion of the plurality of conductive vias and the plurality of contact members.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some implementations, described herein, provide a sensor package 205 that includes a MEMS element having through-silicon vias, an ASIC electrically bonded to the through-silicon vias, and a protective layer disposed between the MEMS element and the ASIC and surrounding electrical bonding areas between the MEMS element and the ASIC. In some implementations, the protective layer is composed of one or more materials that are capable of providing stress decoupling between the MEMS element and the ASIC, and capable of protecting the electrical bonding areas from corrosion.

Improved structural integrity of the sensor package permits proper sealing of a pressure port of the sensor (which typically involves the application of a large amount of force at the pressure port). In addition, protecting the electrical bonding areas between the MEMs element and the ASIC also prevents corrosion, thereby further ensuring the proper operation of the sensor components, and extending the life of the sensor package.

Further, a tighter sensor package also protects the sensor components, such as the MEMS element, from target media, which permits use of the sensor package for various applications, such as in environments that contain harsh media. Furthermore, separating the MEMS element from the ASIC also provides a uniform, or unified, sensor package configuration that can be used for different types of applications. This offers flexibility in chip selection (e.g., the type of pressure sensor or cell to use, the type of ASIC to use, and/or the like) depending on the application, thus permitting faster production times. Moreover, the use of through-silicon vias permits reduced sensor package sizes (e.g., allows for small, flatter sensor modules, such as those having dimensions as small as 4 mm by 4 mm by 2 mm and/or the like) and lowers costs, since no bonding wires (e.g., gold wires/pads, which might otherwise be utilized for media compatibility) may be needed. A reduced sensor package size also reduces or eliminates cavities within the sensor package (e.g., cavities which may become pressurized and, therefore, cause pressure equalization delays in the sensor package), which also ensures the proper operation of the sensor components, and extends the overall life of the sensor package.

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A sensor device, comprising:
   a base layer;
   an application-specific integrated circuit (ASIC) element disposed on the base layer,
      the ASIC element including a plurality of electrical contact points;
   a microelectromechanical system (MEMS) element,
      the MEMS element including a plurality of through-silicon vias;
   a plurality of conductive contact elements disposed in between the MEMS element and the ASIC element,
      the plurality of conductive contact elements being different from the plurality of through-silicon vias,
      each conductive contact element, of the plurality of conductive contact elements, electrically coupling a respective through-silicon via, of the plurality of through-silicon vias, and a respective electrical contact point of the plurality of electrical contact points, and
      the MEMS element being bonded to the ASIC element via the plurality of conductive contact elements;
   a protective layer disposed in between the ASIC element and the MEMS element,
      a first surface of the protective layer being in contact with a surface of the ASIC element,
      a second surface of the protective layer, opposite the first surface, being in contact with a surface of the MEMS element, and
      the protective layer being composed of one or more materials,
         the one or more materials having a physical property defined to permit the protective layer to mitigate stress forces directed from the ASIC element to the MEMS element, to prevent corrosion, and/or to prevent leakage current between electrical connections due to pollution and/or humidity; and
   a mold at least partially surrounding one or more of the ASIC element or the MEMS element,
      the mold being different from the protective layer, the mold at least partially surrounding the MEMS element without being in contact with the MEMS element, the mold forming a cavity, and a gel-based compound filling the cavity formed by the mold.

2. The sensor device of claim 1, wherein the MEMS element includes a pressure sensor, an accelerometer, and/or a gyroscope.

3. The sensor device of claim 1, further comprising a mold compound; and wherein the ASIC element is embedded in the mold compound.

4. The sensor device of claim 3, wherein the physical property is defined to permit the protective layer to mitigate stress forces directed from the mold compound, and via the ASIC element, to the MEMS element.

5. The sensor device of claim 1, wherein the physical property includes a hardness parameter.

6. The sensor device of claim 1, wherein the one or more materials include an adhesive material.

7. The sensor device of claim 6, wherein the adhesive material includes:

silicone,
epoxy,
cynate ester,
acrylat,
polyethylenterephthalat, or
a mold compound.

8. The sensor device of claim 1, wherein the protective layer is disposed about the plurality of conductive contact elements to prevent foreign substances from contacting the plurality of conductive contact elements.

9. The sensor device of claim 1, wherein the ASIC element is implemented in a first chip and the MEMS element is implemented in a second chip; and wherein the first chip is separate from the second chip.

10. The sensor device of claim 1, wherein the ASIC element, the MEMS element, the plurality of conductive contact elements, and the protective layer are disposed in a single sensor package.

11. The sensor device of claim 10, wherein the single sensor package has a first length of about 4 millimeters in a first dimension, a second length of about 4 millimeters in a second dimension, and a third length of about 2 millimeters in a third dimension.

12. The sensor device of claim 1, wherein the sensor device contains no gold wires or gold pads.

13. The sensor device of claim 1, wherein the sensor device contains no bond wire loops that extend beyond a top surface of the MEMS element.

14. The sensor device of claim 1, wherein the protective layer is comprised of:

silicon,
epoxy,
cyanate ester,
acrylate, or
laminated film.

15. A sensor package, comprising:

a frame;

an application-specific integrated circuit (ASIC) element, the ASIC element including:

a plurality of contact members, and a first die, the first die being coupled to the frame;

a microelectromechanical system (MEMS) element, the MEMS element including a second die, the second die including a plurality of conductive vias disposed through the second die, each contact member, of the plurality of contact members, being electrically coupled to a conductive via of the plurality of conductive vias, the plurality of contact members being disposed in between the MEMS element and the ASIC element, the plurality of conductive contact members being different from the plurality of conductive vias, and the MEMS element being bonded to the ASIC element via the plurality of contact members;

a protective layer disposed in between the first die and the second die, a first surface of the protective layer being in contact with a surface of the ASIC element, a second surface of the protective layer, opposite the first surface, being in contact with a surface of the MEMS element, and the protective layer being composed of one or more materials, the one or more materials having a physical property defined to enable the protective layer to prevent forces, impacting the first die, from impacting the second die and/or to prevent corrosion of the plurality of conductive vias and the plurality of contact members; and a mold at least partially surrounding one or more of the ASIC element or the MEMS element, the mold being different from the protective layer, the mold at least partially surrounding the MEMS element without being in contact with the MEMS element, and the mold forming a cavity, and a gel-based compound filling the cavity formed by the mold.

16. The sensor package of claim 15, wherein the physical property includes an elasticity parameter.

* * * * *